US012400836B2

(12) United States Patent
Park et al.

(10) Patent No.: US 12,400,836 B2
(45) Date of Patent: Aug. 26, 2025

(54) SUBSTRATE PROCESS APPARATUS AND SUBSTRATE PROCESS METHOD USING THE SAME

(71) Applicant: Samsung Electronics Co., Ltd., Suwon-si (KR)

(72) Inventors: Jaehyun Park, Suwon-si (KR); Jingoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 415 days.

(21) Appl. No.: 18/105,648

(22) Filed: Feb. 3, 2023

(65) Prior Publication Data

US 2024/0021413 A1 Jan. 18, 2024

(30) Foreign Application Priority Data

Jul. 15, 2022 (KR) .................. 10-2022-0087604

(51) Int. Cl.
*H01L 21/02* (2006.01)
*H01J 37/32* (2006.01)

(52) U.S. Cl.
CPC .. *H01J 37/32477* (2013.01); *H01J 37/32513* (2013.01); *H01J 37/32633* (2013.01); *H01J 37/32642* (2013.01); *H01L 21/02057* (2013.01); *H01J 37/321* (2013.01); *H01J 37/32743* (2013.01); *H01J 2237/3342* (2013.01)

(58) Field of Classification Search
CPC ........... H01J 37/32477; H01J 37/32513; H01J 37/32633; H01J 37/32642; H01J 37/321; H01J 37/32743; H01J 2237/3342; H01J 2237/3321; H01J 2237/334; H01L 21/02057

See application file for complete search history.

(56) References Cited

U.S. PATENT DOCUMENTS

| 7,658,802 B2 | 2/2010 | Fu et al. |
| 2013/0240142 A1 | 9/2013 | Foo et al. |
| 2017/0301514 A1* | 10/2017 | Cho .................. H01J 37/32449 |
| 2018/0230624 A1 | 8/2018 | Dube et al. |

FOREIGN PATENT DOCUMENTS

| KR | 100542031 B1 | 1/2006 |
| KR | 100683416 B1 | 2/2007 |
| KR | 1020070045536 A | 5/2007 |
| KR | 100801857 B1 | 2/2008 |
| KR | 101454861 B1 | 11/2014 |
| KR | 101724100 B1 | 4/2017 |
| KR | 1020190108176 A | 9/2019 |
| KR | 102121598 B1 | 6/2020 |

* cited by examiner

Primary Examiner — Herve-Louis Y Assouman
(74) Attorney, Agent, or Firm — Muir Patent Law, PLLC (57) ABSTRACT

A substrate process apparatus includes a chamber body providing a process space and a chamber lid coupled to the chamber body, the chamber lid includes a focus adapter providing a diffusion space of which width increases in a direction approaching a bottom of the focus adapter, a lid body surrounding the focus adapter, and a coupling adapter supporting the focus adapter, the lid body provides a coupling through hole recessed downwardly from an upper surface of the lid body, the coupling adapter provides a coupling recess recessed downwardly from an upper surface of the coupling adapter, and the coupling recess is spaced apart outwardly from the diffusion space and is located below the coupling through hole.

20 Claims, 12 Drawing Sheets

SUBSTRATE PROCESS APPARATUS AND SUBSTRATE PROCESS METHOD USING THE SAME

CROSS-REFERENCE TO RELATED APPLICATIONS

This U.S. non-provisional patent application claims priority under 35 U.S.C.§ 119 to Korean Patent Application No. 10-2022-0087604, filed on Jul. 15, 2022, in the Korean Intellectual Property Office, the entire contents of which are hereby incorporated by reference.

BACKGROUND OF THE INVENTION

The inventive concept relates to a substrate process apparatus and a substrate process method using the same, and more particularly, relates to a substrate process apparatus capable of preventing damage to a coupling screw and a substrate process method using the same.

A semiconductor device may be manufactured through various processes. For example, the semiconductor device may be manufactured through a photo process, an etching process, a deposition process, and the like on a wafer such as silicon. A photoresist may be applied on a wafer in the photo process. The photoresist material on the wafer should be removed after performing certain processes. To remove the photoresist material from the wafer, an ashing process may be used. In the ashing process, plasma may be used. The plasma may remove the photoresist from the substrate.

SUMMARY

An object of the inventive concept is to provide a substrate process apparatus capable of preventing damage to a coupling screw and a substrate process method using the same.

An object of the inventive concept is to provide a substrate process apparatus capable of improving yield by preventing damage/defects to a substrate and a substrate process method using the same.

An object of the inventive concept is to provide a substrate process apparatus capable of being easily and quickly assembled and a substrate process method using the same.

An object of the inventive concept is to provide a substrate process apparatus capable of effectively maintaining a vacuum in a process space and a substrate process method using the same.

The problem to be solved by the inventive concept is not limited to the problems mentioned above, and other problems not mentioned will be clearly understood by those skilled in the art from the following description.

A substrate process apparatus according to some embodiments of the inventive concept may include a chamber body providing a process space, and a chamber lid coupled to the chamber body, the chamber lid may include a focus adapter providing a diffusion space of which width increases in a direction approaching a bottom of the focus adapter, a lid body surrounding the focus adapter, and a coupling adapter supporting the focus adapter, the lid body may provide a coupling through hole recessed downwardly from an upper surface of the lid body, the coupling adapter may provide a coupling recess recessed downwardly from an upper surface of the coupling adapter, and the coupling recess may be spaced apart outwardly from the diffusion space and is located below the coupling through hole.

A substrate process apparatus according to some embodiments of the inventive concept may include a chamber body defining a process space configured such that a substrate is disposed in the process space, and a chamber lid on the chamber body, the chamber lid may include a focus adapter defining a diffusion space connected to the process space, a lid body surrounding the focus adapter, and a coupling adapter fixing the focus adapter to the lid body, the coupling adapter may include a support ring and a plurality of support blocks protruding inwardly from the support ring, the plurality of support blocks may be spaced apart from each other in a circumferential direction along the support ring, and the focus adapter may be positioned on the plurality of support blocks.

A substrate process method according to some embodiments of the inventive concept may include placing a substrate in a substrate process apparatus, supplying a gas to the substrate process apparatus, generating plasma using the gas supplied to the substrate process apparatus, and processing the substrate with the plasma, the substrate process apparatus may include a chamber body providing a process space in which the substrate is disposed and a chamber lid on the chamber body, the chamber lid may include a focus adapter providing a diffusion space in which the plasma is diffused, a lid body surrounding the focus adapter, and a coupling adapter supporting the focus adapter, the lid body may provide a coupling through hole connected to an upper surface of the lid body, and the coupling adapter may provide a coupling recess positioned below the coupling through hole.

BRIEF DESCRIPTION OF THE DRAWINGS

Example embodiments will be more clearly understood from the following description taken in conjunction with the accompanying drawings. The accompanying drawings represent non-limiting, example embodiments as described herein.

DETAILED DESCRIPTION

Hereinafter, embodiments of the inventive concept will be described with reference to the accompanying drawings. Like reference numerals may refer to like elements throughout the specification.

Figure 1:
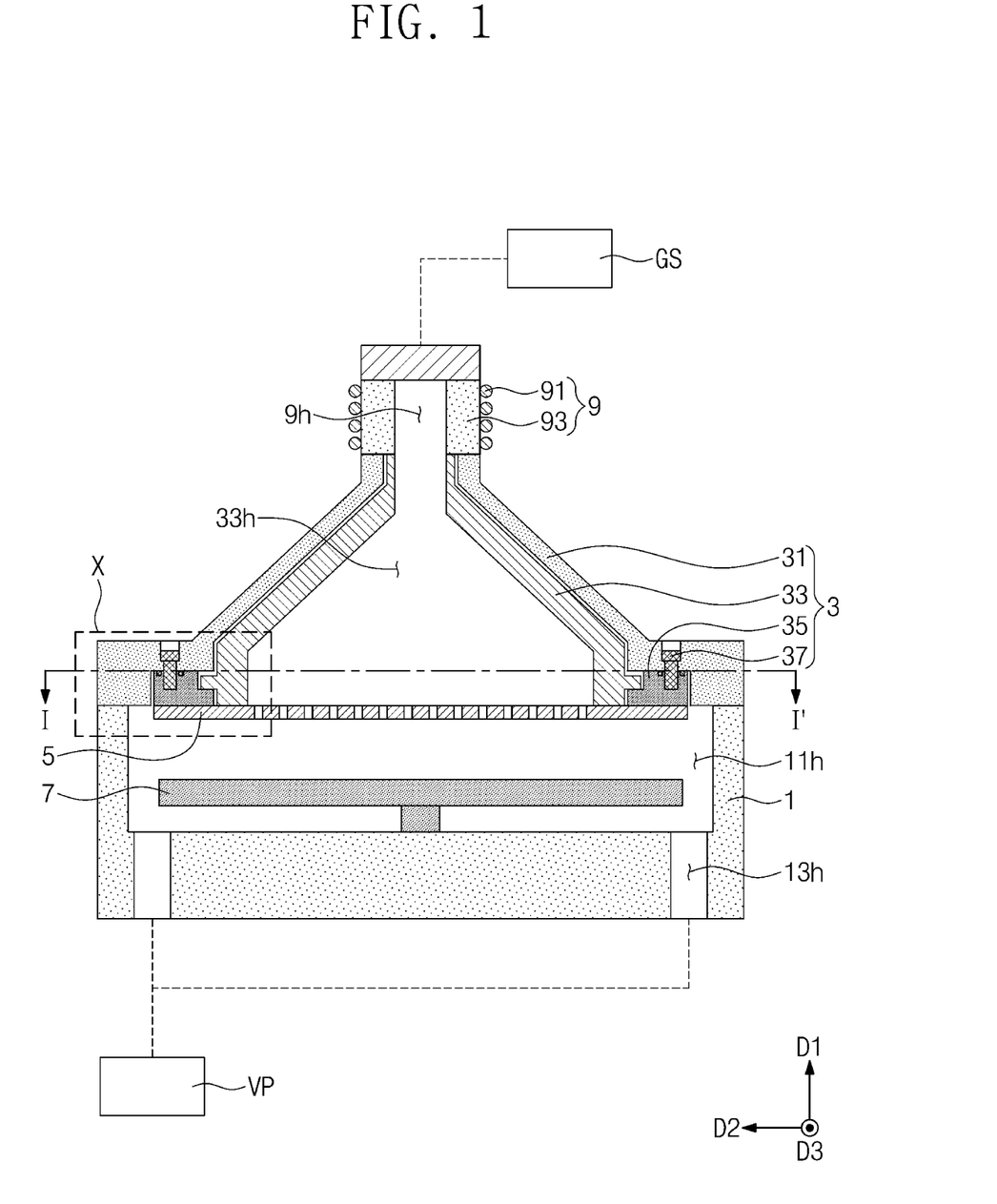
FIG. 1 is a cross-sectional view illustrating a substrate process apparatus according to embodiments of the inventive concept.
Figure 2:
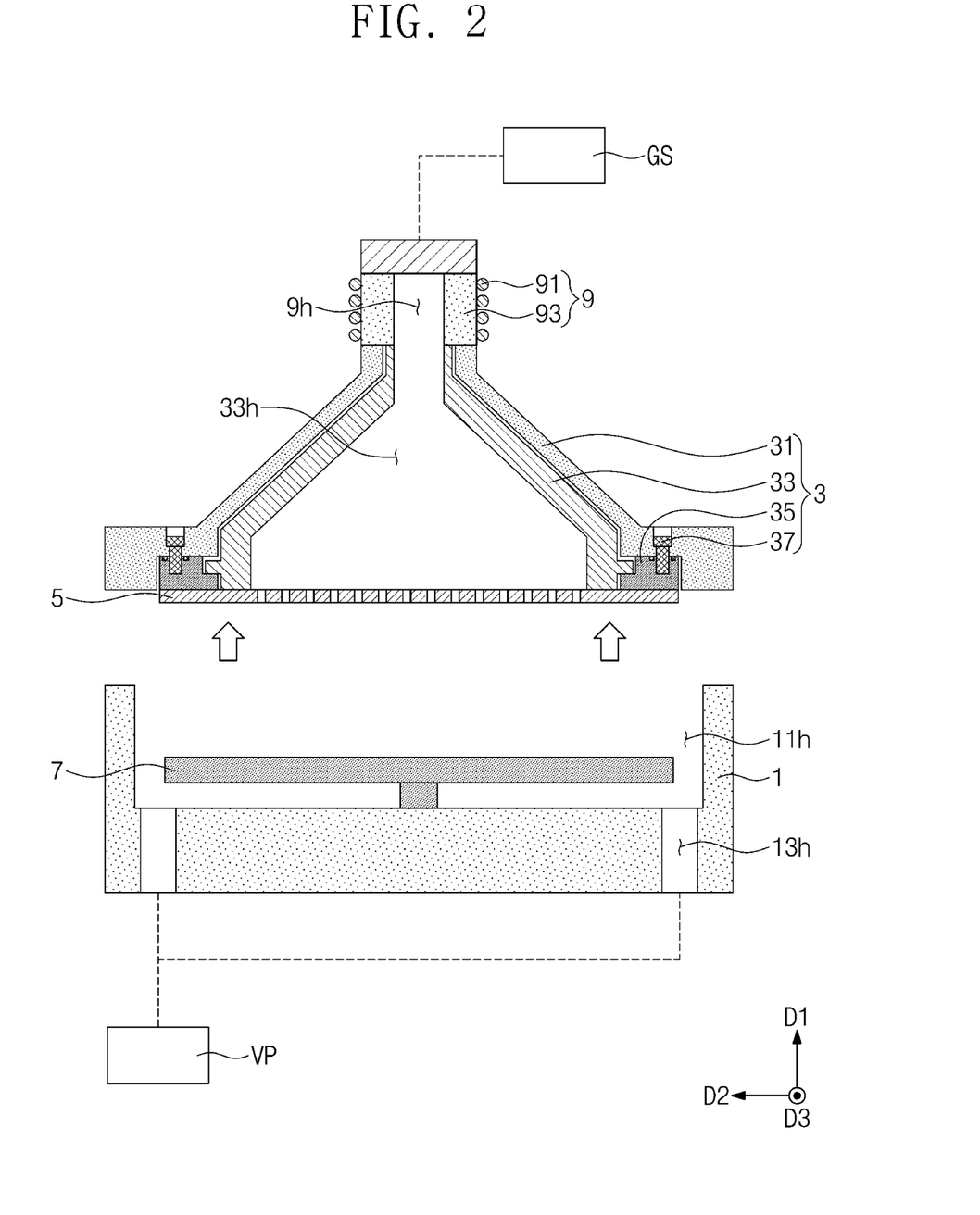
FIG. 2 is an exploded cross-sectional view illustrating a substrate process apparatus according to embodiments of the inventive concept.

FIG. 1 is a cross-sectional view illustrating a substrate process apparatus according to embodiments of the inventive concept. FIG. 2 is an exploded cross-sectional view illustrating a substrate process apparatus according to embodiments of the inventive concept.

Hereinafter, D1 may be referred to as a first direction, D2 intersecting the first direction D1 may be referred to as a second direction, and D3 intersecting each of the first direction D1 and the second direction D2 may be referred to as a third direction. The first direction D1 may be a vertical direction. In addition, each of the second direction D2 and the third direction D3 may be a horizontal direction. For example, the first, second and third directions D1, D2 and D3 may be perpendicular to each other.

Referring to FIGS. 1 and 2, a substrate process apparatus may be provided. The substrate process apparatus may be an apparatus for processing a substrate using plasma. The term "substrate" used herein may denote a silicon (Si) wafer, but is not limited thereto. For example, the term "substrate" may denote a substrate itself, or a stack structure including a substrate and predetermined layers or films formed on a surface of the substrate. In addition, the term "surface of a substrate" may denote an exposed surface of the substrate itself, or an external surface of a predetermined layer or a film formed on the substrate. The substrate process apparatus may be, for example, an apparatus for an ashing process. For example, the substrate process apparatus may be an ashing chamber. A photoresist on the substrate may be removed by the substrate process apparatus. For example, the photoresist on the substrate disposed in the substrate process apparatus may be removed from the substrate by plasma. However, the inventive concept is not limited thereto, and the substrate process apparatus may be another type of chamber/apparatus for an etching process and/or a deposition process. Hereinafter, for convenience, the chamber/apparatus is illustrated and described based on the ashing chamber.

The substrate process apparatus may include a chamber body 1, a chamber lid 3, a baffle 5, a chuck 7, a plasma generator 9, a gas supplier GS, a discharge pump VP, and the like.

The chamber body 1 may provide a process space 11h. The process space 11h provided by the chamber body 1 may have an open top. For example, when the chamber lid 3 is separated from the chamber body 1, the process space 11h may be exposed to the outside. When the chamber lid 3 is coupled to the chamber body 1, the process space 11h may be separated from the outside. A substrate may be disposed in the process space 11h. When the substrate is disposed in the process space 11h, a process for the substrate may be performed. For example, when the substrate process apparatus is an ashing chamber, an ashing process may be performed on the substrate when the substrate is in the process space 11h. The chamber body 1 may further provide an outlet 13h. The outlet 13h may be connected to the process space 11h. The outlet 13h may be disposed below the process space 11h, but is not limited thereto. The outlet 13h may be connected to the discharge pump VP. A fluid in the process space 11h may be discharged from the chamber and/or the process space 11 through the outlet 13h by a vacuum pressure provided by the discharge pump VP.

The chamber lid 3 may be coupled on the chamber body 1. The chamber lid 3 may be detachably coupled to the chamber body 1. The chamber lid 3 may selectively close the process space 11h. The chamber lid 3 may include a focus adapter 33, a lid body 31, a coupling adapter 35, a coupling screw 37, and the like.

The focus adapter 33 may provide a diffusion space 33h. For example, the diffusion space 33h may be defined by an inner surface of the focus adapter 33. The diffusion space 33h may become wider downwardly. For example, horizontal area/width of the diffusion space 33h may increase in a direction approaching a bottom of the focus adapter 33. For example, a diameter of the diffusion space 33h may linearly increase downwardly. For example, diameters/widths of the diffusion space 33h in a horizontal direction may increase in a direction moving downwards. The diffusion space 33h may be connected to the plasma generator 9. For example, the diffusion space 33h may be connected to a plasma generating space 9h provided by the plasma generator 9. In addition, the diffusion space 33h may be connected to the process space 11h. For example, the diffusion space 33h may be connected to the process space 11h through the baffle 5. Plasma produced by the plasma generator 9 may be horizontally and downwardly diffused through the diffusion space 33h and the baffle 5. The plasma passing through the baffle 5 may be introduced into the process space 11h. Details thereon will be described later.

The lid body 31 may surround the focus adapter 33. For example, the lid body 31 may surround the focus adapter 33 in a horizontal direction. For example, the lid body 31 may horizontally overlap the whole focus adapter 33. An inner surface of the lid body 31 may be spaced apart from an outer surface of the focus adapter 33 outwardly. A term "outwardly" as used herein may mean a direction away from a vertical axis of the chuck 7. For example, the outward direction may be a direction receding from an axis of symmetry passing through the center of the chuck 7 and extending in a vertical direction. The lid body 31 may be selectively coupled to the chamber body 1. The lid body 31 may include or be formed of, for example, quartz, but is not limited thereto.

Spatially relative terms, such as "horizontal," "vertical," "beneath," "below," "lower," "above," "upper," "top," "bottom" and the like, may be used herein for ease of description to describe positional relationships. It will be understood that the spatially relative terms encompass different orientations of the device in addition to the orientation depicted in the figures.

The coupling adapter 35 may support the focus adapter 33. The coupling adapter 35 may fix the focus adapter 33 to the lid body 31. The coupling adapter 35 may be fixed to the lid body 31.

The coupling screw 37 may couple the coupling adapter 35 and the lid body 31 to each other. For example, the coupling adapter 35 may be fixed to the lid body 31 by the coupling screw 37. The coupling screw 37 may be exposed on an upper surface of the lid body 31. The coupling screw 37 may not be exposed to the process space 11h. Details thereon will be described later.

The baffle 5 may be positioned between the chamber body 1 and the chamber lid 3. The baffle 5 may be located above the process space 11h and below the diffusion space 33h. The baffle 5 may provide an inlet 5h (refer to FIG. 3). The inlet 5h may allow the fluid in the diffusion space 33h to move into the process space 11h. As shown in FIG. 2, the baffle 5 may be fixed to the focus adapter 33, the coupling adapter 35, and/or the lid body 31. However, the inventive concept is not limited thereto, and the baffle 5 may be coupled to the chamber body 1.

The chuck 7 may be located in the chamber body 1. For example, the chuck 7 may be placed in the process space 11h provided by the chamber body 1 and may be supported by the chamber body 1. The chuck 7 may support the substrate in the process space 11h. The chuck 7 may fix the substrate at a predetermined position. To this end, the chuck 7 may include or may be a vacuum chuck, an electrostatic chuck (ESC), or the like.

The plasma generator 9 may be located on the chamber lid 3. The plasma generator 9 may form an electric field and/or a magnetic field to convert some of gas into plasma. The plasma generator 9 may be, for example, an induced coupled plasma (ICP) generator. In this case, the plasma generator 9 may include a coil 91 and a plasma generating body 93. The plasma generating body 93 may provide a plasma generating space 9h. The plasma generating space 9h may be connected to the diffusion space 33h. The coil 91 may surround the plasma generating body 93. However, the inventive concept is not limited thereto, and the plasma generator 9 may generate plasma in other ways.

The gas supplier GS may supply gas to the plasma generator 9. To this end, the gas supplier GS may include a gas tank, a compressor, and/or a valve.

The discharge pump VP may be connected to the outlet 13h. The discharge pump VP may be, for example, a vacuum pump. By the discharge pump VP, the process space 11h may be maintained in a substantially vacuum state, e.g., in a vacuum state.

Figure 3:
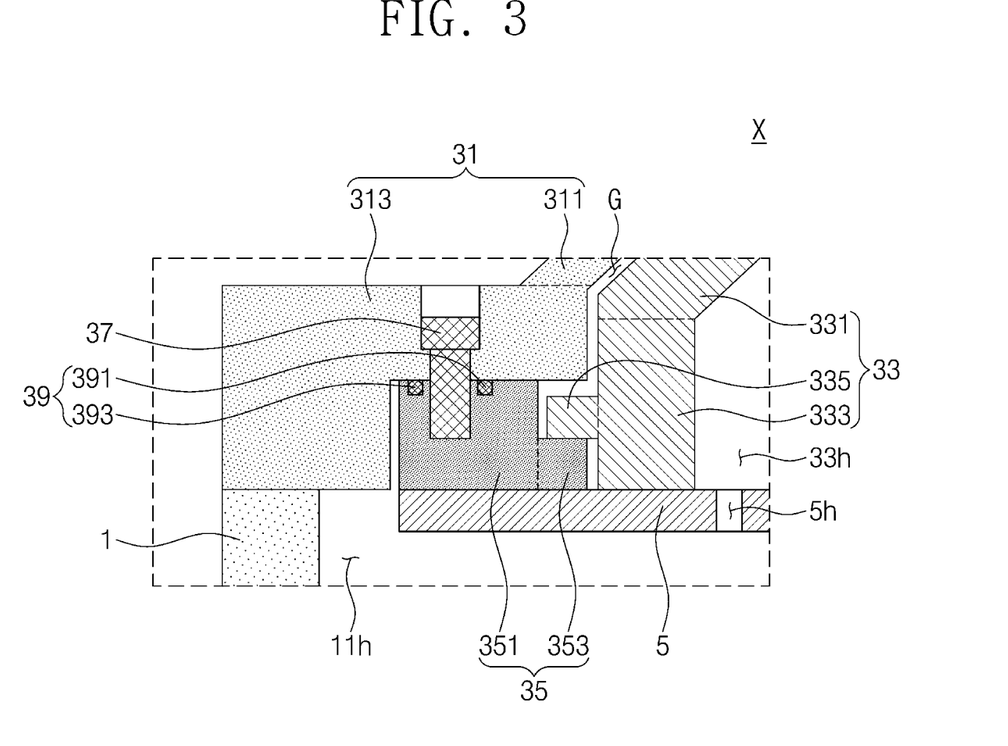
FIG. 3 is an enlarged cross-sectional view of region "X" of FIG. 1.
Figure 4:
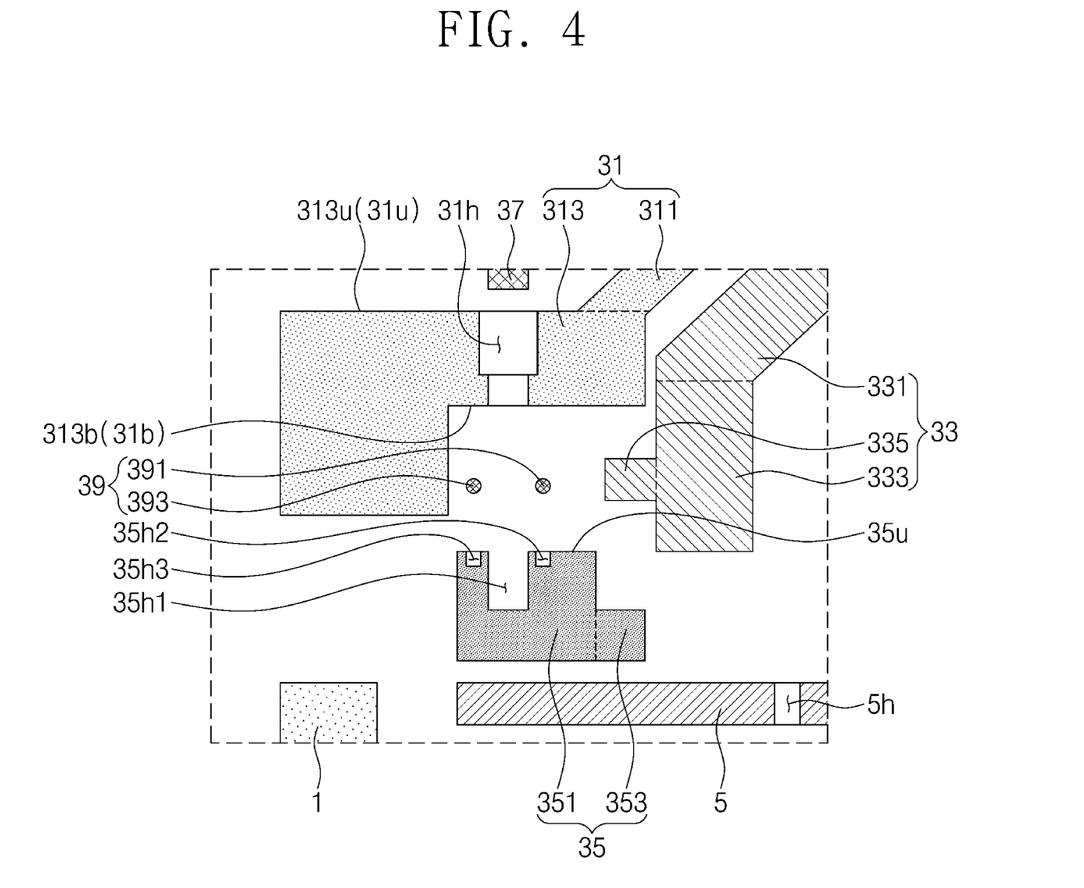
FIG. 4 is an exploded cross-sectional view of FIG. 3.

FIG. 3 is an enlarged cross-sectional view of region "X" of FIG. 1, and FIG. 4 is an exploded cross-sectional view of FIG. 3.

Referring to FIGS. 3 and 4, the lid body 31 may provide a coupling through hole 31h. The coupling through hole 31h may be formed to be depressed from an upper surface of the lid body 31 downwardly. For example, the coupling through hole 31h may vertically extend from an upper surface of the lid body 31 downwardly. Although not shown, a screw structure may be provided on an inner surface defining the coupling through hole 31h. The coupling screw 37 may be inserted into the coupling through hole 31h. The lid body 31 may include an upper body 311 and a lower body 313. An outer diameter and/or inner diameter of the upper body 311 may increase downwardly. For example, the outer/inner diameters/widths of the upper body 311 in a horizontal direction may increase in a direction moving downwards. The lower body 313 may be coupled to a lower end of the upper body 311, e.g., at its upper end. The lower body 313 may be coupled to the chamber body 1, e.g., at its lower end. The lower body 313 and the upper body 311 may be integrally formed, e.g., as one body without boundaries between them, but the inventive concept is not limited thereto. The coupling through hole 31h may be provided in the lower body 313. The coupling through hole 31h may be connected to an upper surface 313u of the lower body 313. For example, the coupling through hole 31h may be formed from the upper surface 313u of the lower body 313 to a bottom surface of the lower body 313. For example, the coupling through hole 31h may penetrate the lower body 313 vertically.

The focus adapter 33 may be supported by the coupling adapter 35. The focus adapter 33 may include an upper adapter 331, a lower adapter 333, and a support member 335.

An outer diameter and/or inner diameter of the upper adapter 331 may increase downwardly. For example, the outer/inner diameters/widths of the upper adapter 331 in a horizontal direction may increase in a direction moving downwards. The upper adapter 331 may be disposed to an inner side of the upper body 311. An outer surface of the upper adapter 331 may be spaced apart from an inner surface of the upper body 311 inwardly. Accordingly, a gap "G" may be formed between the upper adapter 331 and the upper body 311.

The lower adapter 333 may be coupled to and disposed under the upper adapter 331. The lower adapter 333 may be integrally formed with the upper adapter 331, e.g., as one body without boundaries between them, but is not limited thereto. The lower adapter 333 may be located inside the lower body 313. An outer surface of the lower adapter 333 may be spaced apart from an inner surface of the lower body 313 inwardly. Accordingly, the gap "G" may extend between the lower adapter 333 and the lower body 313.

The support member 335 may be coupled to the lower adapter 333. The support member 335 may protrude outwardly from one side of the outer surface of the lower adapter 333. The support member 335 may be supported by the coupling adapter 35. For example, the support member 335 may be located on one side of the coupling adapter 35. For example the support member 335 may contact an upper surface of the coupling adapter 35. The term "contact," "contacting," "contacts," or "in contact with," as used herein, refers to a direct connection (i.e., touching) unless the context clearly indicates otherwise.

The coupling adapter 35 may provide a coupling recess 35h1. The coupling recess 35h1 may be recessed downwardly from an upper surface 35u of the coupling adapter 35. The coupling recess 35h1 may be located outside the diffusion space 33h. The coupling recess 35h1 may be located below the coupling through hole 31h. The coupling recess 35h1 may be connected to the coupling through hole 31h. Although not shown, a screw structure may be provided on an inner surface defining the coupling recess 35hl. The coupling screw 37 may be inserted into the coupling recess 35hl.

The coupling adapter 35 may provide a sealing hole. The sealing hole may be recessed downwardly from the upper surface 35u of the coupling adapter 35. The sealing hole may extend in a circumferential direction. A plurality of sealing holes may be provided in the coupling adapter 35. For example, a first sealing hole 35h2 and a second sealing hole 35h3 may be provided in the coupling adapter 35. The first sealing hole 35h2 may be located inside the coupling recess 35hl. The second sealing hole 35h3 may be located outside the coupling recess 35hl.

The coupling adapter 35 may include a support ring 351 and a support block 353.

The support ring 351 may have a ring shape extending in a circumferential direction. The support ring 351 may be provided with the coupling recess 35h1 in the support ring 351. For example, the coupling recess 35h1 may be connected to an upper surface of the support ring 351. A height/depth of the coupling recess 35h1 may be smaller than a thickness of the support ring 351. Accordingly, the coupling recess 35h1 may be spaced upwardly from a lower surface of the coupling adapter 35. For example, a bottom surface of the coupling recess 35h1 may be at a higher level than a bottom surface of the coupling adapter 35. Therefore, the coupling recess 35h1 may not be connected to a lower space of the support ring 351. For example, the coupling recess 35h1 may not be exposed to the process space 11h. The support ring 351 may include or be formed of, but is not limited to, aluminum (Al).

The support block 353 may be coupled to the support ring 351. The support block 353 may protrude inwardly from the support ring 351. The support block 353 may be integrally formed with the support ring 351, e.g., as one body without boundaries between the support block 353 and the support ring 351, but is not limited thereto. The support block 353 may support the focus adapter 33. For example, the support member 335 may be positioned on the support block 353 and supported by the support block 353. For example, the support member 335 may contact the support block 353. The support block 353 may include or be formed of aluminum (Al), but is not limited thereto. A plurality of support blocks 353 may be provided in the coupling adapter 35. The plurality of support blocks 353 may be disposed to be spaced apart from each other in a circumferential direction along the support ring 351. However, hereinafter, unless otherwise specified, the support block 353 will be described in the singular. For example, the single support block 353 described below may represent one of the plural support blocks 353 or may describe embodiments including a single support block 353 in the coupling adapter 35. For example, when the coupling adapter 35 includes a single support block 353, the single support block 353 may extend in a circumferential direction along the support ring 351 to form a ring shape or may extend in the circumferential direction along the support ring 351 more than a half of the support ring 351. The details thereof will be described later with reference to FIGS. 5 and 6.

The chamber lid 3 (refer to FIG. 1) may further include a sealing ring 39. The sealing ring 39 may be, for example, an O-ring. The sealing ring 39 may be located on the support ring 351. The sealing ring 39 may extend in a circumferential direction along the support ring 351. The chamber lid 3 may include a plurality of sealing rings 39. For example, a first sealing ring 391 and a second sealing ring 393 may be provided in the chamber lid 3. The first sealing ring 391 may be located inside the coupling recess 35h1 in a plan view. The second sealing ring 393 may be located outside the coupling recess 35h1 in the plan view. The first sealing ring 391 may be inserted into the first sealing hole 35h2. The second sealing ring 393 may be inserted into the second sealing hole 35h3. By the first sealing ring 391 and the second sealing ring 393, fluid may be prevented from leaking into a gap between the lid body 31 and/or the coupling adapter 35 and the coupling screw 37.

Figure 5:
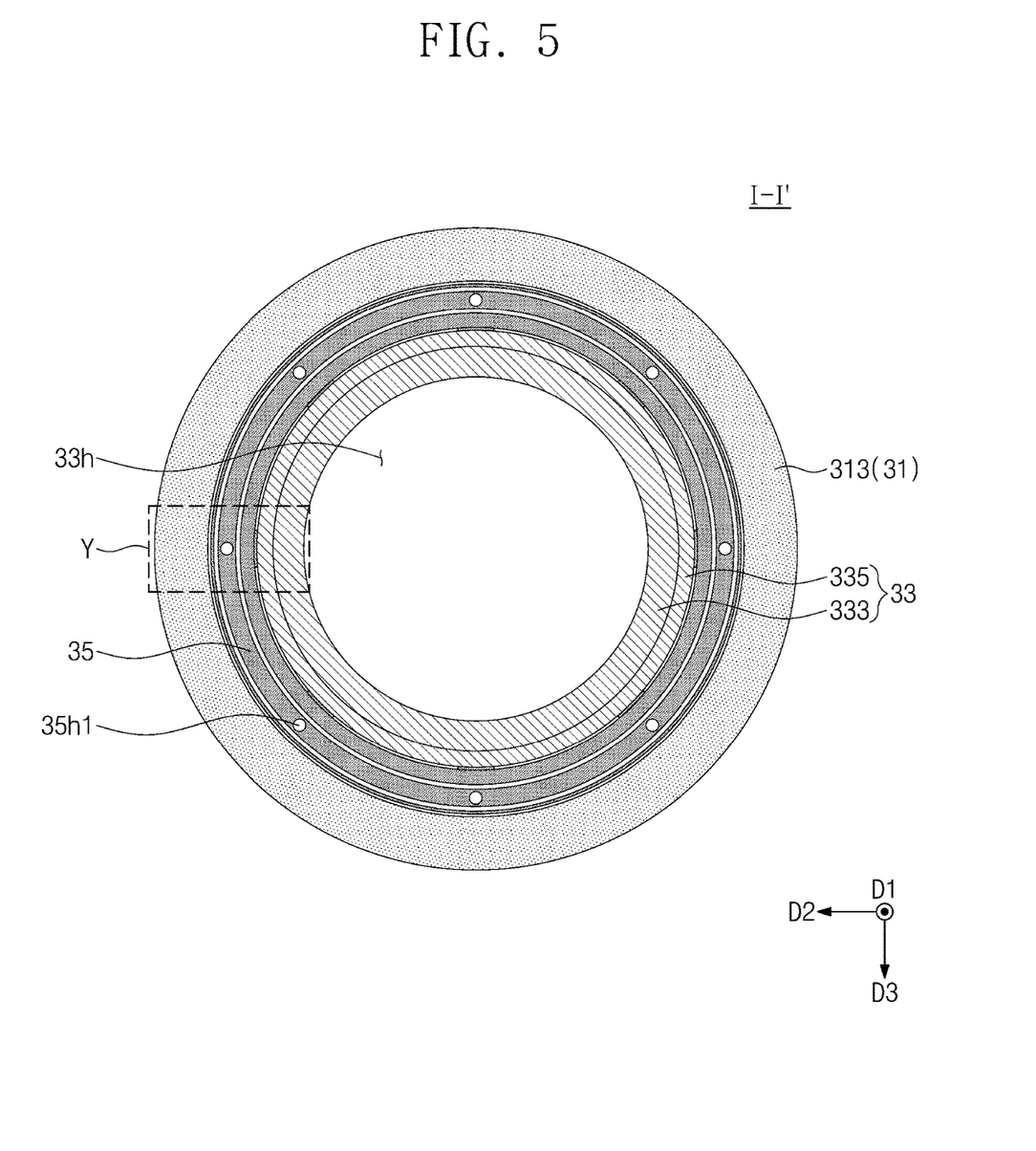
FIG. 5 is a plan view taken along line I-I' of FIG. 1.
Figure 6:
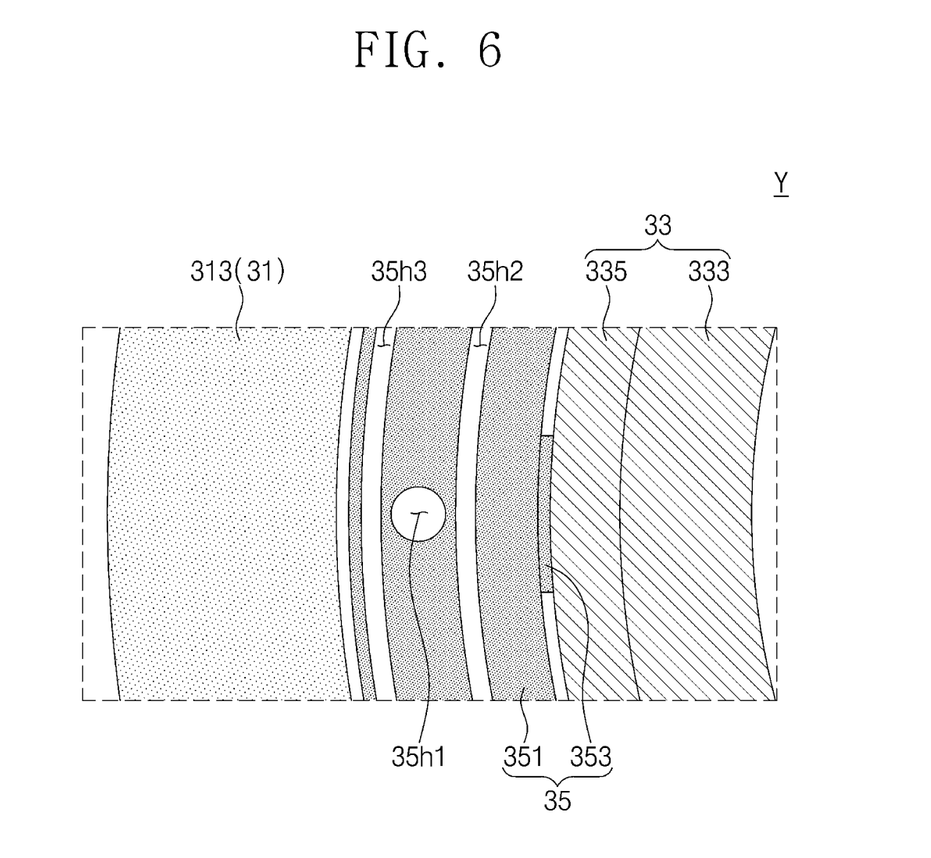
FIG. 6 is a plan view illustrating an enlarged region "Y" of FIG. 5.

FIG. 5 is a plan view taken along line I-I' of FIG. 1, and FIG. 6 is a plan view illustrating an enlarged region "Y" of FIG. 5.

Referring to FIGS. 5 and 6, the coupling recess 35h1 may be provided in plurality. A plurality of coupling recesses 35h1 may be spaced apart from each other in a circumferential direction. However, hereinafter, for convenience, the coupling recess 35h1 will be described in the singular. For example, the coupling recess 35h1 may represent each of the plurality of the coupling recesses 35h1.

The support ring 351 may extend in a circumferential direction. Each of the first sealing ring 35h2 and the second sealing ring 35h3 may extend in a circumferential direction. The plurality of support blocks 353 may be disposed to be spaced apart from each other in a circumferential direction along the support ring 351.

Figure 7:
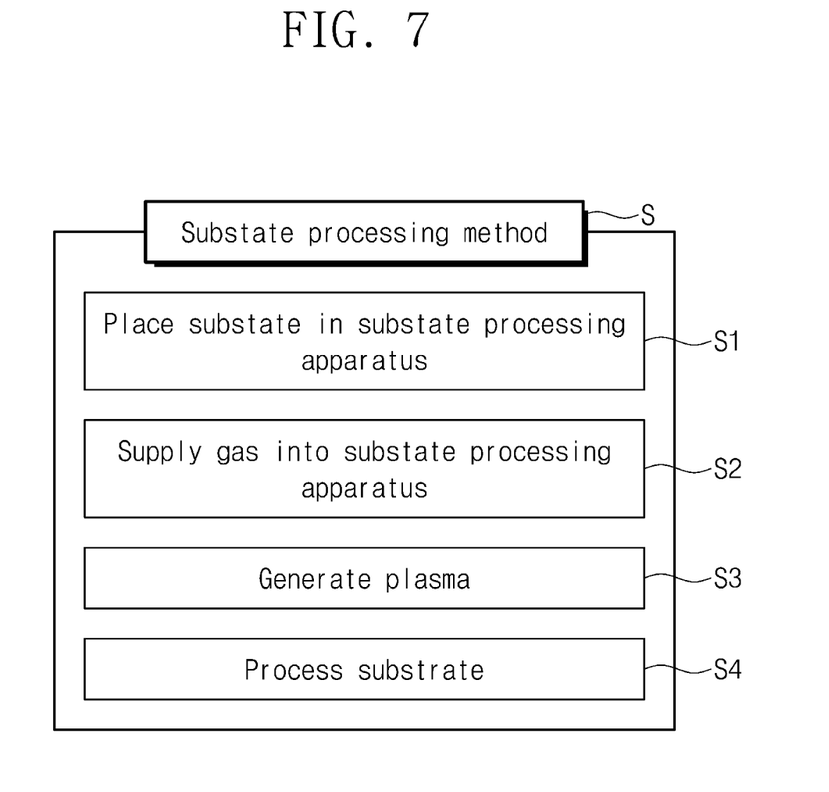
FIG. 7 is a flowchart illustrating a substrate process method according to embodiments of the inventive concept.

FIG. 7 is a flowchart illustrating a substrate process method according to embodiments of the inventive concept.

Referring to FIG. 7, a substrate process method "S" may be provided. The substrate process method "S" may be a method of performing a process on a substrate using the substrate process apparatus described with reference to FIGS. 1 to 6. The substrate process method "S" may include placing a substrate in the substrate process apparatus in S1, supplying a gas into the substrate process apparatus in S2, generating plasma in S3, and processing the substrate in S4.

Hereinafter, the substrate process method "S" of FIG. 7 will be sequentially described with reference to FIGS. 8 to 10.

Figure 8:
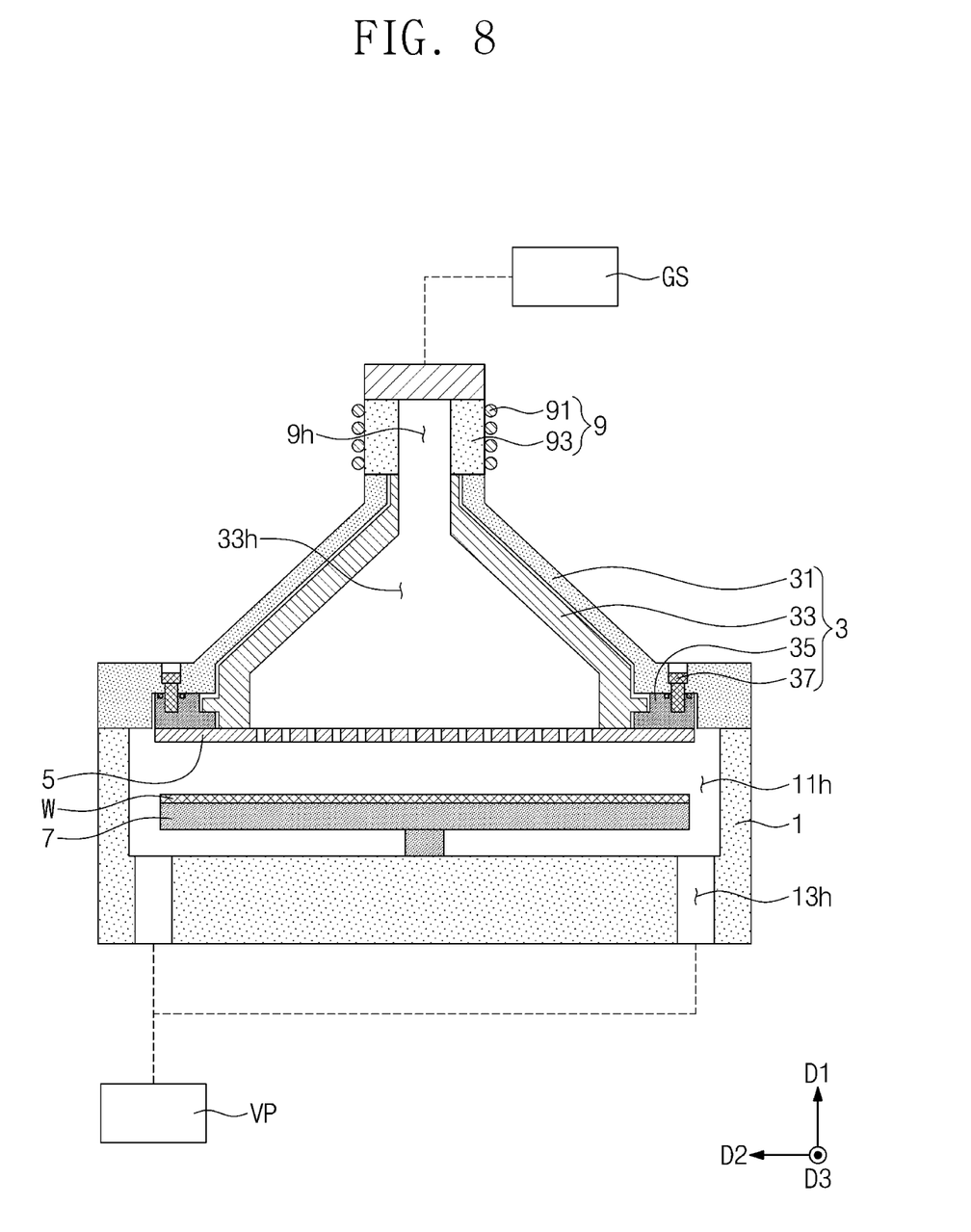
FIGS. 8 to 10 are cross-sectional views sequentially illustrating a substrate process method according to the flowchart of FIG. 7.
Figure 9:
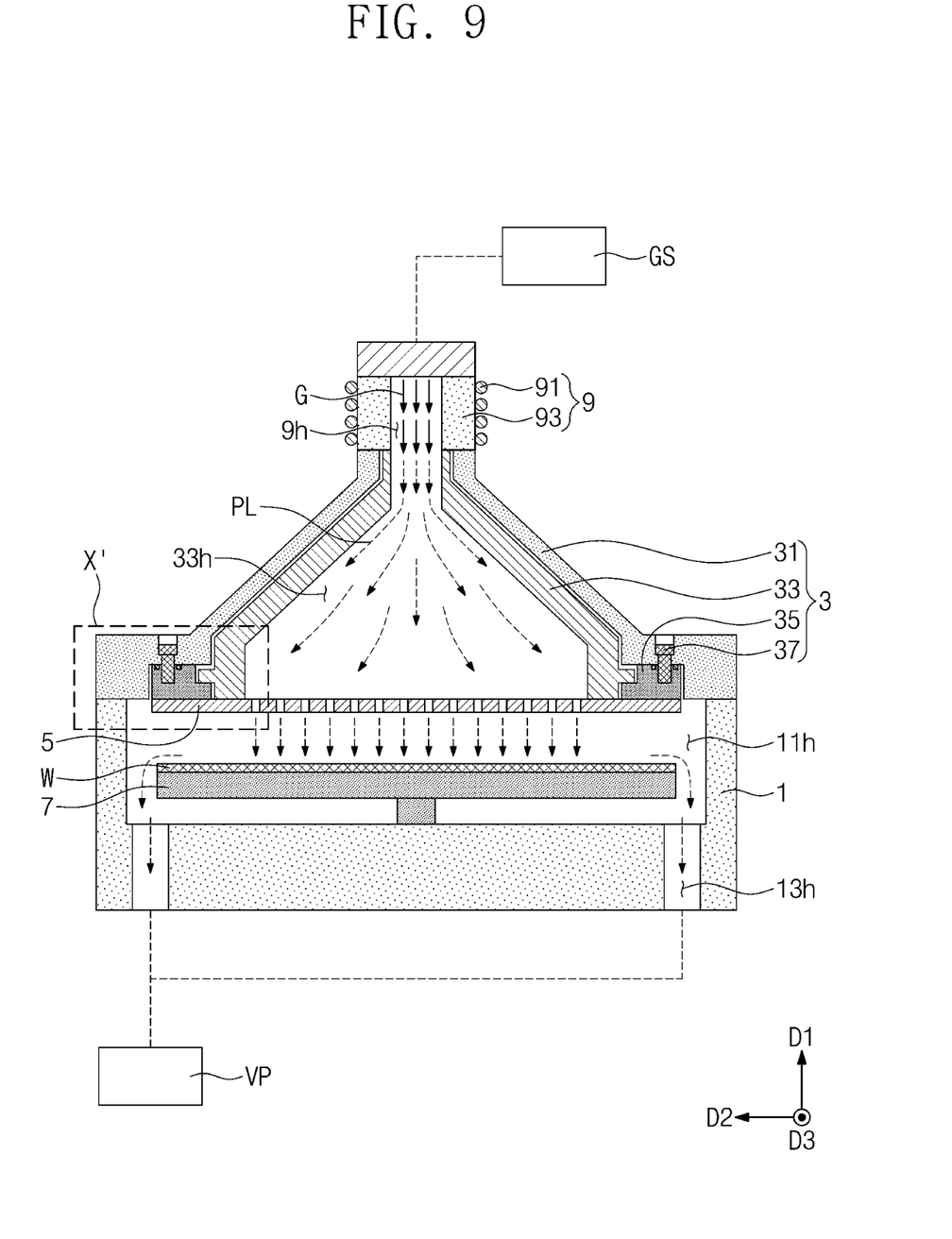
Figure 10:
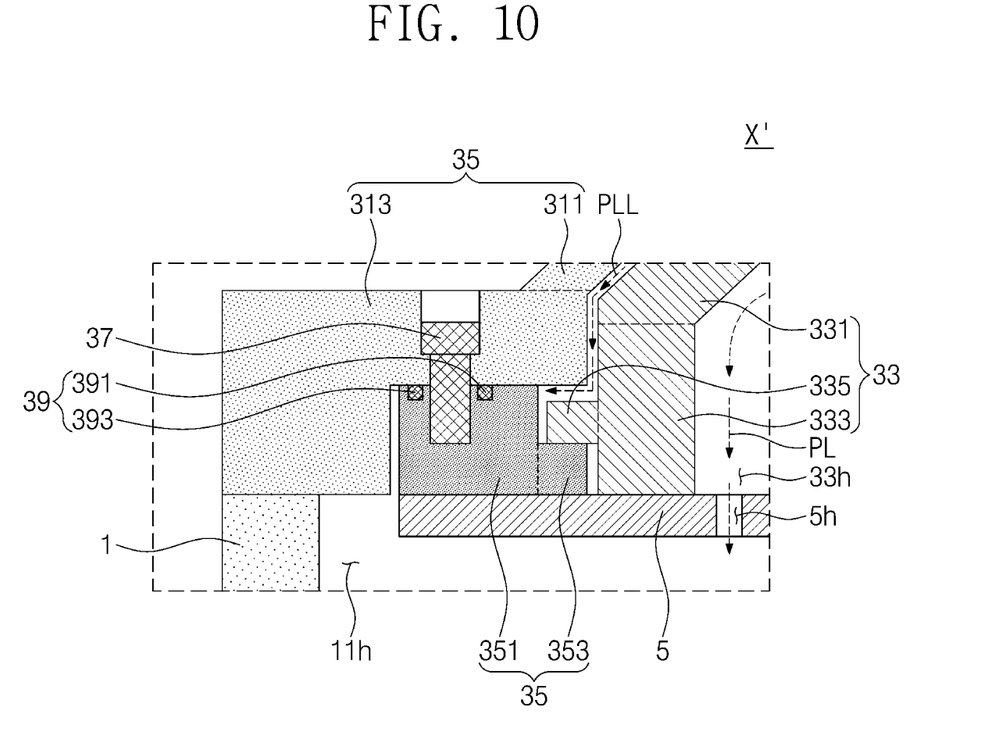

FIGS. 8 to 10 are cross-sectional views sequentially illustrating a substrate process method according to the flowchart of FIG. 7.

Referring to FIGS. 8 and 7, the placing of the substrate in the substrate process apparatus in S1 may include disposing a substrate "W" on a chuck 7. The substrate "W" may be a silicon (Si) wafer, but is not limited thereto. In embodiments, the substrate "W" may be in a state in which a photoresist is applied. For example, after the photoresist is applied on the substrate "W", the substrate "W" in a state in which a pattern is formed through an etching process may be disposed on the chuck 7. However, the inventive concept is not limited thereto, and the substrate "W" may be in another state. The chuck 7 may fix the substrate "W". For example, the chuck 7 may use a vacuum pressure and/or an electrostatic force to fix the substrate "W" at a certain position.

Referring to FIGS. 9 and 7, the supplying of the gas into the substrate process apparatus in S2 may include supplying the gas "G" by a gas supplier GS. The gas "G" may be supplied to a plasma generator 9. The gas "G" may be introduced into a plasma generating space 9h.

The generating of the plasma in S3 may include converting at least a portion of the gas in the plasma generating space 9h into plasma PL by the plasma generator 9. For example, at least a portion of the gas may be converted into the plasma PL by an electric field and/or a magnetic field formed by a coil 91.

Referring to FIGS. 9, 10 and 7, the processing of the substrate in S4 may include moving the plasma PL onto the substrate "W". For example, the plasma PL may pass through a diffusion space 33h and a baffle 5 and may be diffused in a horizontal direction, and then may move onto the substrate "W". When the substrate process method "S" is a method of performing an ashing process, the photoresist on the substrate "W" may be removed by the plasma PL. However, the inventive concept is not limited thereto, and an etching process and/or a deposition process by plasma PL may be performed.

Referring to FIG. 10, some plasma PLL may move through a gap "G". Some plasma PLL moving through the gap "G" may be prevented from reaching the coupling screw 37 by a first sealing ring 391 and a second sealing ring 393.

According to the substrate process apparatus and the substrate process method using the same according to embodiments of the inventive concept, the plasma may be prevented from reaching the coupling screw. For example, the plasma may be prevented from reaching the coupling screw by the sealing ring. For example, the plasma may not reach the coupling screw. Accordingly, damage to the coupling screw may be prevented. For example, the coupling screw may be inserted downwardly from the upper surface of the lid body, and thus the coupling screw may be prevented from being exposed to the process space. Accordingly, damage to the coupling screw may be prevented to increase lifespan of the coupling screw. In addition, particles generated by damage to the coupling screw may be prevented. Accordingly, the substrate may be prevented from being contaminated by particles or the like. The damage to the substrate may be prevented, and thus manufacturing yield may be improved. For example, the aforementioned structures of the embodiments may be beneficial to the lifespans of the substrate processing apparatus and its parts, and beneficial to the yield of the substrates processed by the apparatus.

According to the substrate process apparatus and the substrate process method using the same according to embodiments of the inventive concept, the coupling adapter may be provided in a form of an integrated ring. Accordingly, the chamber lid may be combined to the chamber body 1 fast and simple.

According to the substrate process apparatus and the substrate process method using the same according to embodiments of the inventive concept, the coupling screw may be inserted from the upper surface of the lid body downwardly, and thus the assembly of the coupling screw may be simple and quick.

According to the substrate process apparatus and the substrate process method using the same according to embodiments of the inventive concept, the coupling screw may be surrounded by the sealing ring. Therefore, even when a part of the coupling screw is exposed to the external space above the chamber lid, the external space and the process space may be prevented from being connected through the gap between the coupling screw and the chamber lid. Therefore, it is possible to maintain a vacuum state of the process space.

Figure 11:
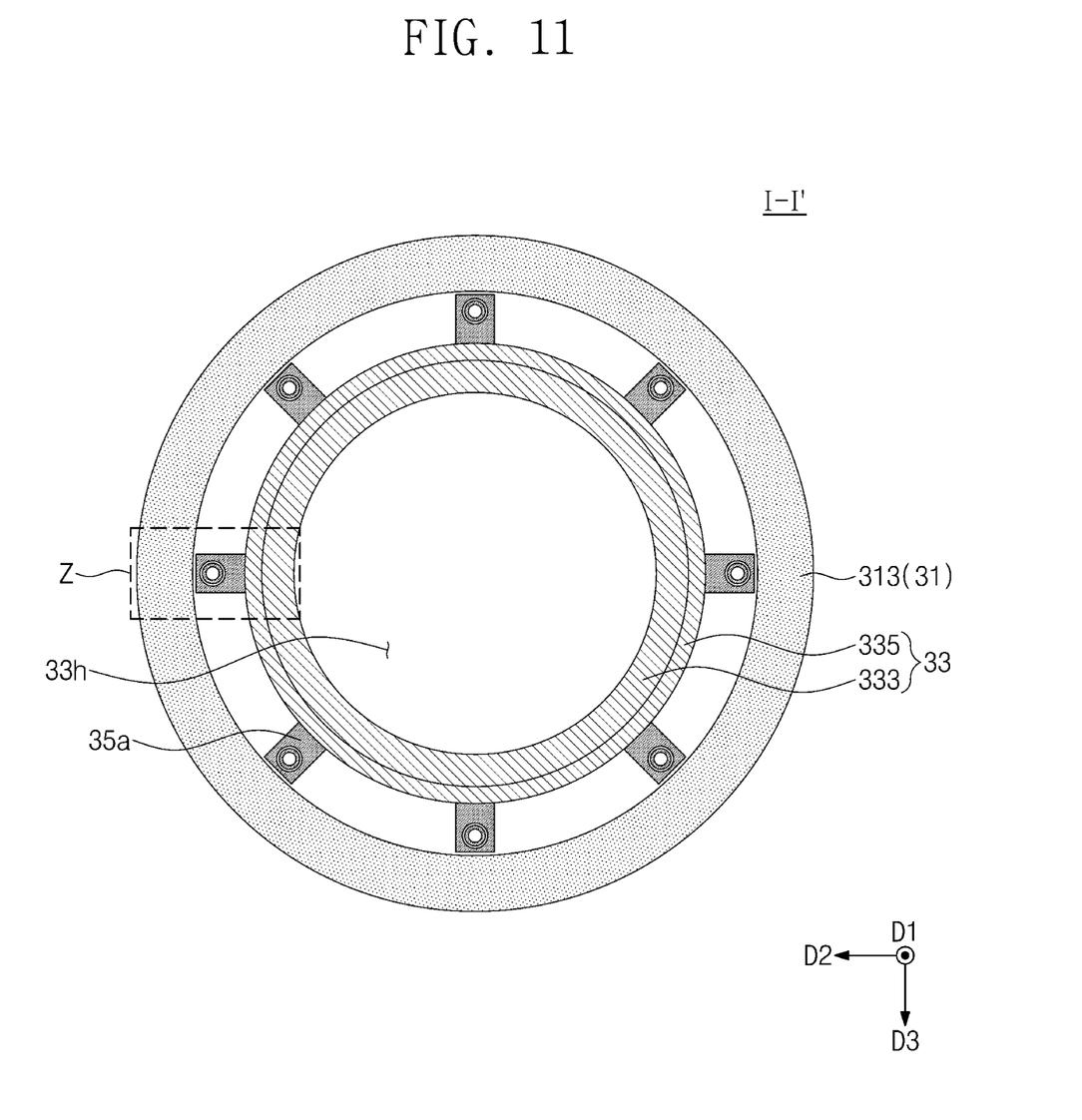
FIG. 11 is a plan view taken along line I-I' of FIG. 1.
Figure 12:
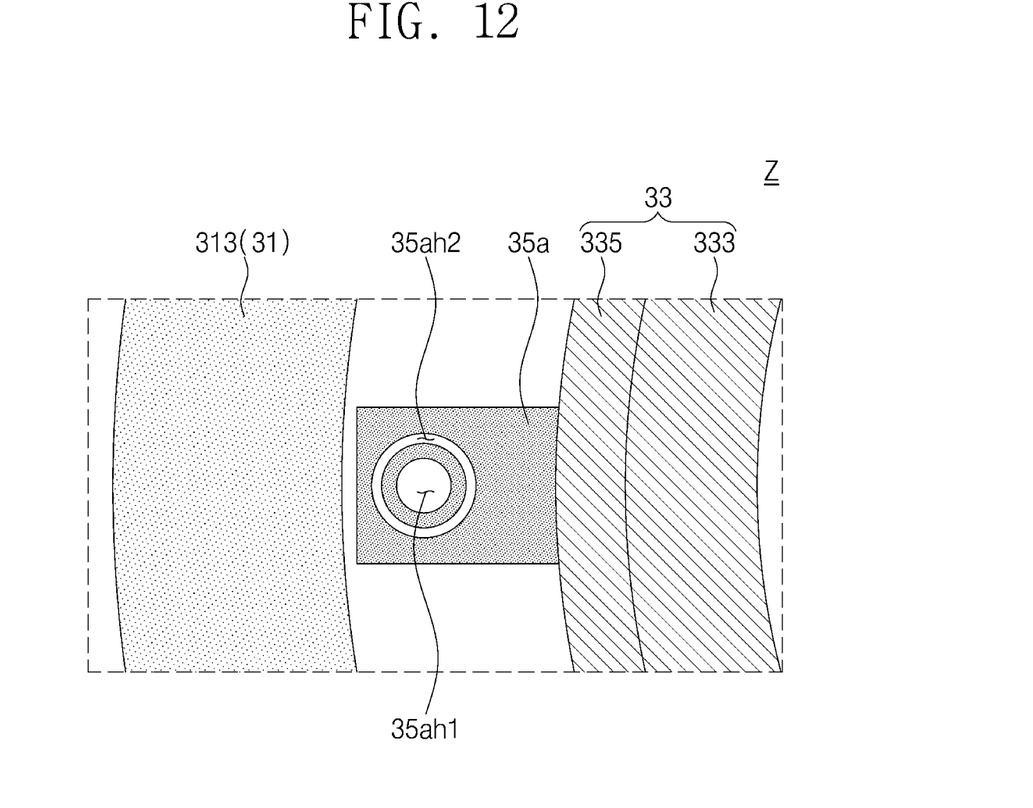
FIG. 12 is a plan view illustrating an enlarged region "Z" of FIG. 11.

FIG. 11 is a plan view taken along line I-I' of FIG. 1, and FIG. 12 is a plan view illustrating an enlarged region "Z" of FIG. 11.

Hereinafter, descriptions of contents the same or substantially the same as or similar to those described with reference to FIGS. 1 to 10 may be omitted. For example, omitted descriptions of elements may be the same as the descriptions of corresponding elements of embodiments described above.

Referring to FIG. 11, a coupling adapter 35a may be provided. However, unlike the coupling adapter 35 described with reference to FIGS. 5 and 6, the coupling adapter 35a of FIGS. 11 and 12 may not have a ring shape. For example, a plurality of discrete/separate coupling adapters 35a may be provided. For example, eight coupling adapters 35a may be provided. However, the inventive concept is not limited thereto, and the number of coupling adapters 35a may vary depending on specific design application. The plurality of coupling adapters 35a may be disposed to be spaced apart from each other in a circumferential direction. However, hereinafter, for convenience, the coupling adapter 35a will be described in the singular. For example, the coupling adapter 35a described below may represent each of the plural coupling adapters 35a.

Referring to FIG. 12, the coupling adapter 35a may provide a sealing hole 35ah2. The sealing hole 35ah2 may be recessed downwardly from an upper surface of the coupling adapter 35a. The sealing hole 35ah2 may surround the coupling recess 35ah1, e.g., in a plan view.

According to the substrate process apparatus and the substrate process method using the same of the inventive concept, the damage to the coupling screw may be prevented.

According to the substrate process apparatus and the substrate process method using the same of the inventive concept, the damage to the substrate may be prevented and the yield may be improved. For example, the aforementioned structures of the embodiments of FIGS. 11 and 12 may be beneficial to the lifespans of the substrate processing apparatus and its parts, and beneficial to the yield of the substrates processed by the apparatus.

According to the substrate process apparatus and the substrate process method using the same of the inventive concept, the assembly may be simple and quick.

According to the substrate process apparatus and the substrate process method using the same of the inventive concept, the vacuum in the process space may be maintained. For example, the substrate process apparatus of the above embodiments may be beneficial to maintaining vacuum states in the diffusion space 33h and in the process space 11h.

The effects of the inventive concept are not limited to the above-mentioned effects, and other effects not mentioned above will be clearly understood by those skilled in the art from the above description.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

While embodiments are described above, a person skilled in the art may understand that many modifications and variations are made without departing from the spirit and scope of the inventive concept defined in the following claims. Accordingly, the example embodiments of the inventive concept should be considered in all respects as descriptive/illustrative and not restrictive, with the spirit and scope of the inventive concept being indicated by the appended claims.

What is claimed is:

1. A substrate process apparatus comprising:
a chamber body providing a process space; and
a chamber lid coupled to the chamber body,
wherein the chamber lid includes:
 a focus adapter providing a diffusion space of which width increases in a direction approaching a bottom of the focus adapter;
 a lid body surrounding the focus adapter; and
 a coupling adapter supporting the focus adapter,
 wherein the lid body provides a coupling through hole recessed downwardly from an upper surface of the lid body,
 wherein the coupling adapter provides a coupling recess recessed downwardly from an upper surface of the coupling adapter, and
 wherein the coupling recess is spaced apart outwardly from the diffusion space and is located below the coupling through hole.

2. The substrate process apparatus of claim 1, wherein the chamber lid further includes a coupling screw fixing the coupling adapter to the lid body, and
wherein the coupling screw is inserted into the coupling through hole and the coupling recess.

3. The substrate process apparatus of claim 1, further comprising a baffle disposed between the diffusion space and the process space,
wherein the diffusion space is connected to the process space through the baffle.

4. The substrate process apparatus of claim 3, wherein the coupling recess is spaced apart upwardly from a lower surface of the coupling adapter, and the coupling recess is not exposed to the process space.

5. The substrate process apparatus of claim 1, wherein the chamber lid further includes a sealing ring between the coupling adapter and the lid body,
wherein the sealing ring surrounds the coupling recess in a plan view.

6. The substrate process apparatus of claim 5, wherein the coupling adapter further provides a sealing hole recessed downwardly from an upper surface of the coupling adapter,
wherein the sealing hole surrounds the coupling recess in a plan view, and
wherein the sealing ring is inserted into the sealing hole.

7. The substrate process apparatus of claim 1, wherein the chamber lid includes a plurality of coupling adapters, and
wherein the plurality of coupling adapters are disposed to be spaced apart in a circumferential direction.

8. The substrate process apparatus of claim 7, wherein the chamber lid includes eight coupling adapters.

9. The substrate process apparatus of claim 1, further comprising:
an induced coupled plasma (ICP) generator configured to generating plasma; and
a chuck configured to support a substrate in the process space,
wherein the ICP generator is located on the chamber lid.

10. A substrate process apparatus comprising:
a chamber body defining a process space configured such that a substrate is disposed in the process space; and
a chamber lid on the chamber body,
wherein the chamber lid includes:
a focus adapter defining a diffusion space connected to the process space;
a lid body surrounding the focus adapter; and
a coupling adapter fixing the focus adapter to the lid body,
wherein the coupling adapter includes:
a support ring; and
a plurality of support blocks protruding inwardly from the support ring,
wherein the plurality of support blocks are spaced apart from each other in a circumferential direction along the support ring, and
wherein the focus adapter is positioned on the plurality of support blocks.

11. The substrate process apparatus of claim 10, wherein the lid body provides a coupling through hole recessed downwardly from an upper surface of the lid body,
wherein the support ring provides a coupling recess recessed downwardly from an upper surface of the support ring, and
wherein the coupling recess is spaced apart outwardly from the diffusion space and is connected to the coupling through hole.

12. The substrate process apparatus of claim 11, wherein the chamber lid further includes a first sealing ring and a second sealing ring extending in a circumferential direction along the support ring on the support ring,
wherein the first sealing ring is located inside the coupling recess, and
wherein the second sealing ring is located outside the coupling recess.

13. The substrate process apparatus of claim 12, wherein the support ring includes:
a first sealing hole recessed downwardly from an upper surface of the support ring; and
a second sealing hole recessed downwardly from the upper surface of the support ring,
wherein the first sealing hole is located inside the coupling recess, and
wherein the second sealing hole is located outside the coupling recess.

14. The substrate process apparatus of claim 11, wherein the chamber lid further includes a coupling screw fixing the coupling adapter to the lid body, and
wherein the coupling screw is inserted into the coupling through hole and the coupling recess.

15. The substrate process apparatus of claim 10, further comprising a plasma generator; and
a gas supplier configured to supply gas to the plasma generator,
wherein the plasma generator is positioned on the chamber lid and configured to convert the gas supplied from the gas supplier into plasma.

16. The substrate process apparatus of claim 10, wherein the lid body includes quartz.

17. The substrate process apparatus of claim 10, wherein the support ring and the plurality of support blocks include aluminum (Al).

18. A substrate process method comprising:
placing a substrate in a substrate process apparatus;
supplying a gas to the substrate process apparatus;
generating plasma using the gas supplied to the substrate process apparatus; and
processing the substrate with the plasma,
wherein the substrate process apparatus includes:
a chamber body providing a process space in which the substrate is disposed; and
a chamber lid on the chamber body,
wherein the chamber lid includes:
a focus adapter providing a diffusion space in which the plasma is diffused;
a lid body surrounding the focus adapter; and
a coupling adapter supporting the focus adapter,
wherein the lid body provides a coupling through hole connected to an upper surface of the lid body, and
wherein the coupling adapter provides a coupling recess positioned below the coupling through hole.

19. The substrate process method of claim 18, wherein the substrate process apparatus further includes a baffle between the diffusion space and the process space,
wherein the diffusion space is connected to the process space through the baffle, and
wherein the processing of the substrate with the plasma includes moving the plasma from the diffusion space to the process space through the baffle.

20. The substrate process method of claim 18, wherein the processing of the substrate using the plasma includes removing a photoresist (PR) from the substrate by the plasma.

* * * * *